United States Patent
Kim et al.

(10) Patent No.: US 10,756,154 B2
(45) Date of Patent: Aug. 25, 2020

(54) DISPLAY DEVICE INCLUDING A LIGHT BLOCKING LAYER OVER A PIXEL DEFINING LAYER

(71) Applicant: SAMSUNG DISPLAY CO., LTD., Yongin-si, Gyeonggi-do (KR)

(72) Inventors: Byung-chul Kim, Yongin-si (KR); Sujeong Kim, Yongin-si (KR); Kiyoung Yeon, Yongin-si (KR); Sun-kyu Joo, Yongin-si (KR); Chul Huh, Yongin-si (KR); Inok Kim, Yongin-si (KR); Hyeran Mun, Yongin-si (KR); Inseok Song, Yongin-si (KR); Wooyoung Lee, Yongin-si (KR); Yui-ku Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 15/984,618

(22) Filed: May 21, 2018

(65) Prior Publication Data

US 2019/0027547 A1    Jan. 24, 2019

(30) Foreign Application Priority Data

Jul. 19, 2017 (KR) .................. 10-2017-0091659

(51) Int. Cl.
*H01L 27/32* (2006.01)
*H01L 51/52* (2006.01)
(Continued)

(52) U.S. Cl.
CPC ...... *H01L 27/3272* (2013.01); *H01L 27/3246* (2013.01); *H01L 27/3258* (2013.01);
(Continued)

(58) Field of Classification Search
CPC ............. H01L 27/3246; H01L 27/3272; H01L 51/5281; H01L 51/5284
(Continued)

(56) References Cited

U.S. PATENT DOCUMENTS

| 5,114,832 A | 5/1992 | Zertani et al. |
| 8,519,407 B2 | 8/2013 | Park |

(Continued)

FOREIGN PATENT DOCUMENTS

| KR | 10-0645715 B1 | 11/2006 |
| KR | 10-2008-0001999 A | 1/2008 |

(Continued)

*Primary Examiner* — Matthew E Warren
(74) *Attorney, Agent, or Firm* — Lewis Roca Rothgerber Christie LLP

(57) ABSTRACT

A display device including a substrate that includes a circuit layer; an insulating layer on the substrate; a pixel defining layer on the insulating layer, the pixel defining layer having an opening exposing a region of a top surface of the insulating layer; a light blocking layer covering a top surface and a side surface of the pixel defining layer; and an organic electroluminescent element in the opening, wherein the organic electroluminescent element includes a first electrode on the region of the top surface of the insulating layer exposed through the opening; at least one organic layer on the first electrode; and a second electrode on the at least one organic layer.

16 Claims, 13 Drawing Sheets

(51) Int. Cl.
 *H01L 51/56* (2006.01)
 *H01L 27/12* (2006.01)
(52) U.S. Cl.
 CPC ...... *H01L 51/5253* (2013.01); *H01L 51/5281* (2013.01); *H01L 51/5284* (2013.01); *H01L 51/56* (2013.01); *H01L 27/124* (2013.01); *H01L 27/1248* (2013.01); *H01L 27/322* (2013.01); *H01L 27/323* (2013.01); *H01L 27/3211* (2013.01); *H01L 27/3218* (2013.01); *H01L 27/3262* (2013.01); *H01L 27/3276* (2013.01); *H01L 2227/323* (2013.01)
(58) Field of Classification Search
 USPC .............................................. 257/40, 88, 98
 See application file for complete search history.

(56) References Cited

U.S. PATENT DOCUMENTS

| | | | |
|---|---|---|---|
| 8,585,938 B1 | 11/2013 | Jinkerson et al. | |
| 2014/0354139 A1* | 12/2014 | Yoon | H05B 33/12 313/498 |
| 2015/0357602 A1* | 12/2015 | Li | H01L 51/5284 257/40 |
| 2016/0322444 A1 | 11/2016 | Kang et al. | |
| 2016/0372528 A1* | 12/2016 | Kamura | H01L 51/0096 |
| 2017/0179092 A1* | 6/2017 | Sasaki | G09G 3/006 |

FOREIGN PATENT DOCUMENTS

| | | |
|---|---|---|
| KR | 10-2012-0095197 A | 8/2012 |
| KR | 10-2016-0130071 A | 11/2016 |

* cited by examiner

DISPLAY DEVICE INCLUDING A LIGHT BLOCKING LAYER OVER A PIXEL DEFINING LAYER

CROSS-REFERENCE TO RELATED APPLICATION

Korean Patent Application No. 10-2017-0091659, filed on Jul. 19, 2017, in the Korean Intellectual Property Office, and entitled: "Display Device," is incorporated by reference herein in its entirety.

BACKGROUND

1. Field

Embodiments relate to a display device.

2. Description of the Related Art

Various display devices used in multimedia devices, e.g., televisions, portable phones, tablet computers, navigation systems, and game consoles have been developed.

SUMMARY

Embodiments are directed to a display device.

The embodiments may be realized by providing a display device including a substrate that includes a circuit layer; an insulating layer on the substrate; a pixel defining layer on the insulating layer, the pixel defining layer having an opening exposing a region of a top surface of the insulating layer; a light blocking layer covering a top surface and a side surface of the pixel defining layer; and an organic electroluminescent element in the opening, wherein the organic electroluminescent element includes a first electrode on the region of the top surface of the insulating layer exposed through the opening; at least one organic layer on the first electrode; and a second electrode on the at least one organic layer.

The light blocking layer may be directly on the top surface and the side surface of the pixel defining layer.

The light blocking layer may further include an auxiliary light blocking portion on the region of the top surface of the insulating layer exposed through the opening.

The auxiliary light blocking portion may be under the first electrode such that the auxiliary light blocking portion is between the first electrode and the insulating layer.

The light blocking layer may include at least one light absorbent.

The light blocking layer may absorb light of a wavelength band ranging from 350 nm to 450 nm.

The light blocking layer may include at least one light absorbent that absorbs light of a wavelength band ranging from 350 nm to 450 nm.

The display device may further include an encapsulating layer on the organic electroluminescent element, wherein the encapsulating layer includes a first light absorbent that absorbs light of a wavelength band ranging from 350 nm to 400 nm.

The display device may further include an input sensor directly on the encapsulating layer.

The display device may further include a polarizing member on the organic electroluminescent element.

The polarizing member may include a second light absorbent that absorbs light of a wavelength band ranging from 350 nm to 400 nm.

The display device may further include a color filter member on the organic electroluminescent element.

The color filter member may include a third light absorbent that absorbs light of a wavelength band ranging from 350 nm to 400 nm.

An electrode connection hole may be defined in the insulating layer, and the display device may further include a connection electrode filling the electrode connection hole and connecting the first electrode to the circuit layer.

The embodiments may be realized by providing a display device including an insulating layer; a pixel defining layer on the insulating layer, the pixel defining layer having an opening exposing a region of a top surface of the insulating layer; a light blocking layer on a top surface of the pixel defining layer, a side surface of the pixel defining layer that is exposed by the opening, and the region of the top surface of the insulating layer that is exposed by the opening; and an organic electroluminescent element in the opening, wherein the organic electroluminescent element includes a first electrode on the light blocking layer; at least one organic layer on the first electrode; and a second electrode on the at least one organic layer.

The light blocking layer may include at least one light absorbent that absorbs light of a wavelength band ranging from 350 nm to 450 nm.

The display device may further include an optical member on the organic electroluminescent element. The optical member may be a polarizing member or color filter member.

The embodiments may be realized by providing a display device including an insulating layer; a first electrode on the insulating layer; a pixel defining layer on the insulating layer, the pixel defining layer having an opening exposing a region of a top surface of the first electrode; a light blocking layer that covers a top surface of the pixel defining layer and a side surface of the pixel defining layer that is exposed through the opening, the light blocking layer including at least one light absorbent that absorbs light of a wavelength band ranging from 350 nm to 450 nm; at least one organic layer in the opening and on the first electrode; and a second electrode on the at least one organic layer.

The display device may further include an optical member the second electrode. The optical member may be a polarizing member or color filter member.

The optical member may include an ultraviolet light absorbent that absorbs light of a wavelength band ranging from 350 nm to 400 nm.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
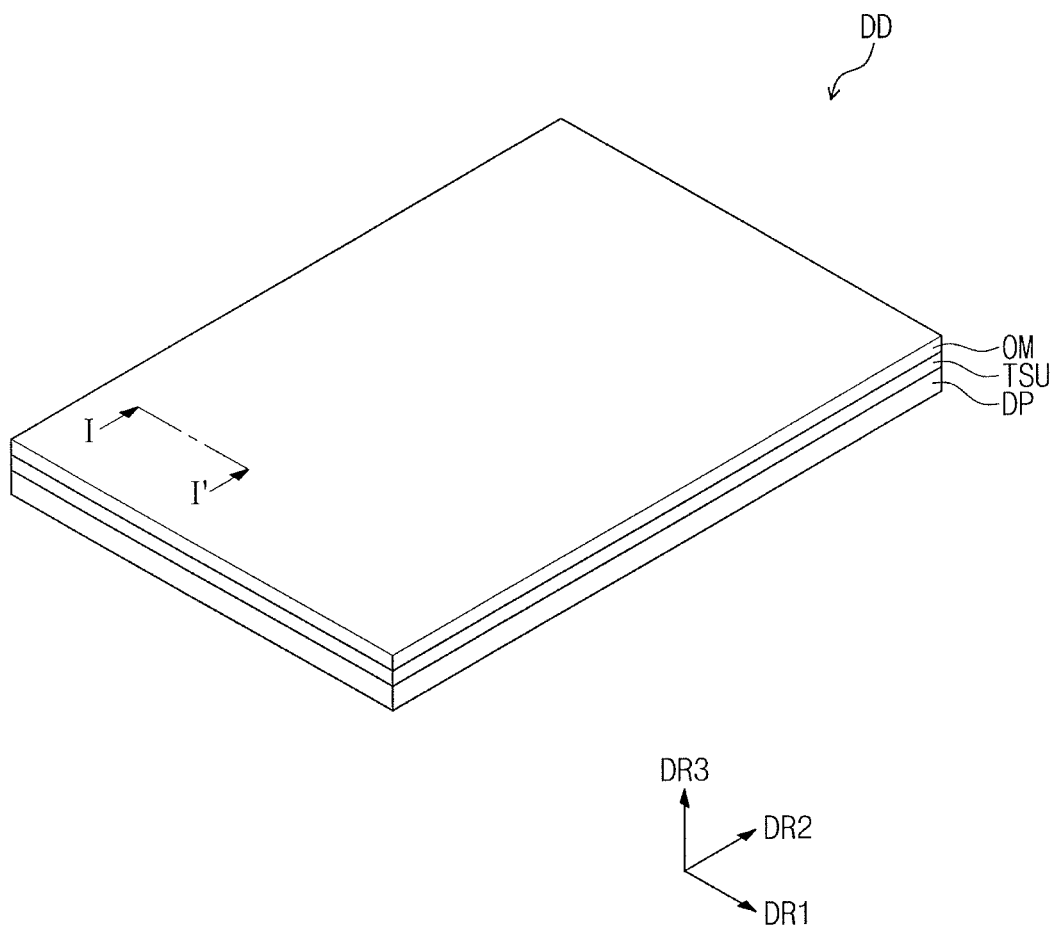
FIG. 1 illustrates a perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means the same as "and/or." As used herein, the terms "and/or" and "or" include any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Display devices according to embodiments will be described hereinafter with reference to the drawings.

FIG. 1 illustrates a perspective view of a display device DD according to an embodiment. The display device DD according to an embodiment may include a display panel DP, an input sensor TSU on the display panel DP, and an optical member OM disposed on the display panel DP. The optical member OM may be on the input sensor TSU.

In an implementation, the display panel DP may be an organic electroluminescent display panel. The optical member OM may block external light provided from the outside to the display panel DP. The optical member OM may be a polarizing member blocking external light or a color filter member having a color filter layer.

The input sensor TSU may sense or recognize a direct touch of a user, an indirect touch of a user, a direct touch of an object, or an indirect touch of an object. The input sensor TSU may sense at least one of a position or strength (e.g., pressure) of a touch provided from the outside. The input sensor TSU according to some embodiments may have at least one of various structures and/or may be formed of at least one of various materials. In an implementation, in the display device DD according to an embodiment, the input sensor TSU may be a touch sensing unit that senses a touch.

In an implementation, as illustrated in FIG. 1, the display device DD may include both the input sensor TSU and the optical member OM. In an implementation, the input sensor TSU may be omitted from the display device DD. In an implementation, the optical member OM may be omitted from the display device DD. In an implementation, both the input sensor TSU and the optical member OM may be omitted from the display device DD.

Figure 2:
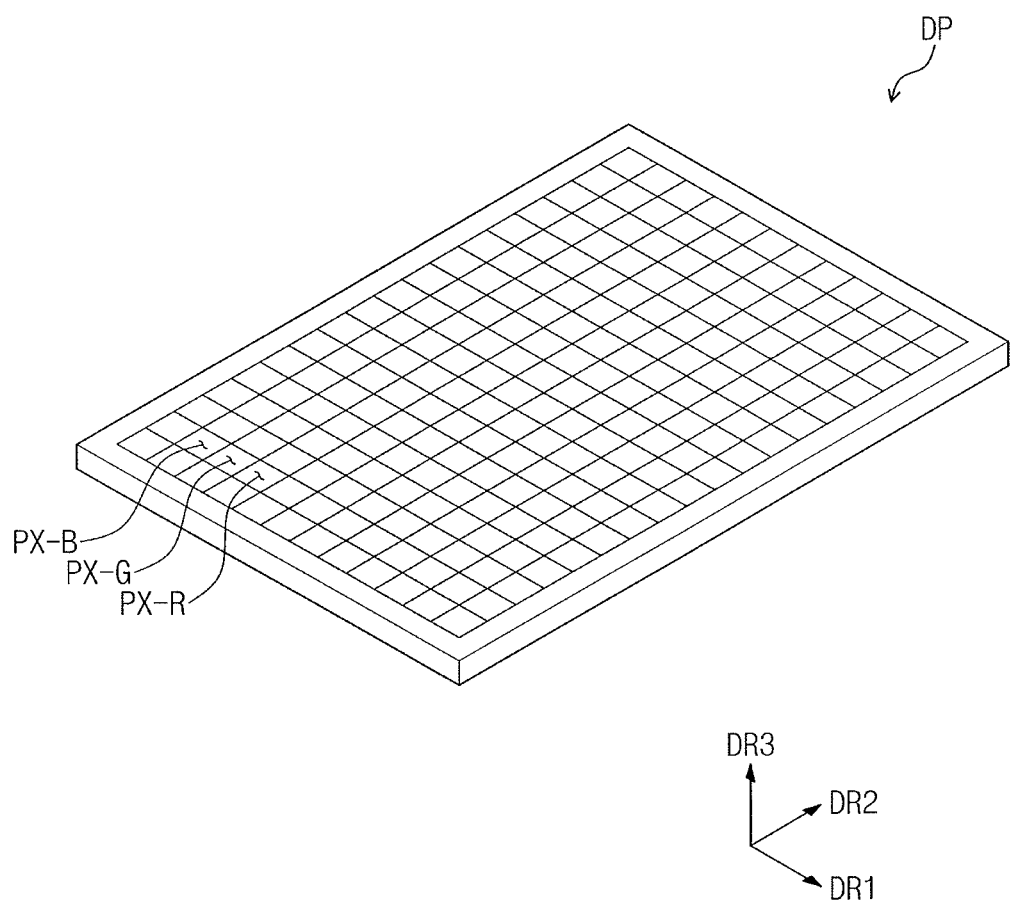
FIG. 2 illustrates a perspective view of a display panel included in a display device according to an embodiment.

FIG. 2 illustrates a perspective view of the display panel DP included in the display device DD illustrated in FIG. 1. As illustrated in FIG. 2, the display panel DP may include a plurality of pixels PX-B, PX-G, and PX-R. In FIG. 2, three kinds of pixels PX-B, PX-G, and PX-R are illustrated as an example. The three kinds of pixels PX-B, PX-G, and PX-R may generate lights of which colors are different from each other. In an implementation, the three kinds of pixels PX-B, PX-G, and PX-R may emit blue light, green light, and red light, respectively. In an implementation, the three kinds of pixels PX-B, PX-G, and PX-R may emit cyan light, yellow light, and magenta light, respectively. In an implementation, the three kinds of pixels PX-B, PX-G, and PX-R may generate the same color light. The three kinds of pixels PX-B, PX-G, and PX-R may emit lights in a third direction DR3 of FIG. 2.

For example, the three kinds of pixels PX-B, PX-G, and PX-R may be arranged in a matrix form on a plane defined by an axis of a first direction DR1 and an axis of a second direction DR2. In addition, each kind of pixels PX-B, PX-G, or PX-R may be arranged in the second direction DR2 to a column. In an implementation, the arrangement of the pixels may be variously modified depending on a method of realizing the display panel. In an implementation, each of the pixels PX-B, PX-G, and PX-R generating lights having different colors from each other may be defined as a sub-pixel, and a combination of these sub-pixels may be defined as a pixel.

The pixel according to an embodiment may be a part corresponding to an organic electroluminescent element of an embodiment to be described later. In an implementation, the three kinds of pixels PX-B, PX-G, and PX-R may correspond to organic electroluminescent elements that have light emitting layers emitting lights of which wavelength bands are different from each other.

Figure 3:
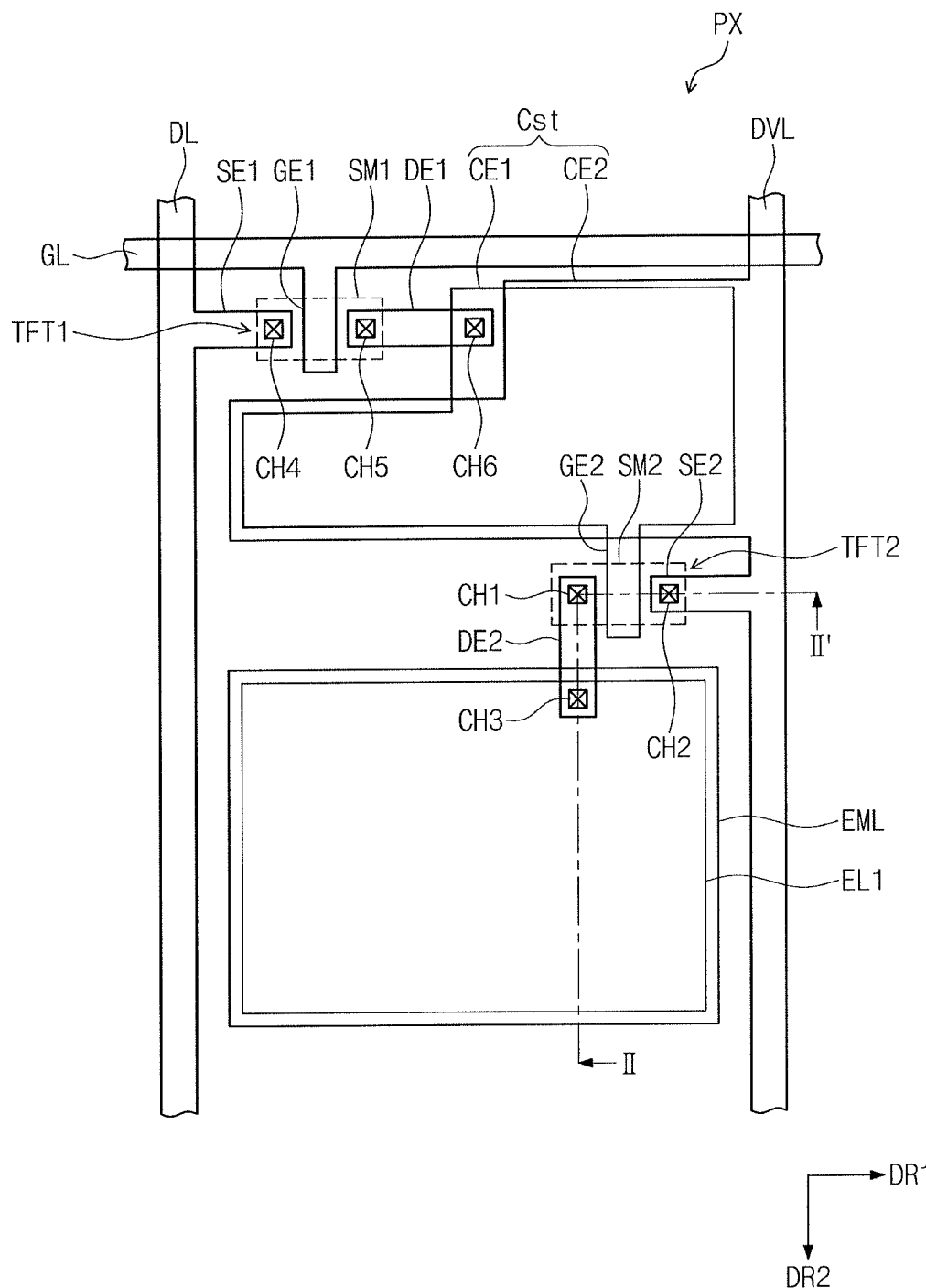
FIG. 3 illustrates a plan view of one pixel included in a display device according to an embodiment.
Figure 4:
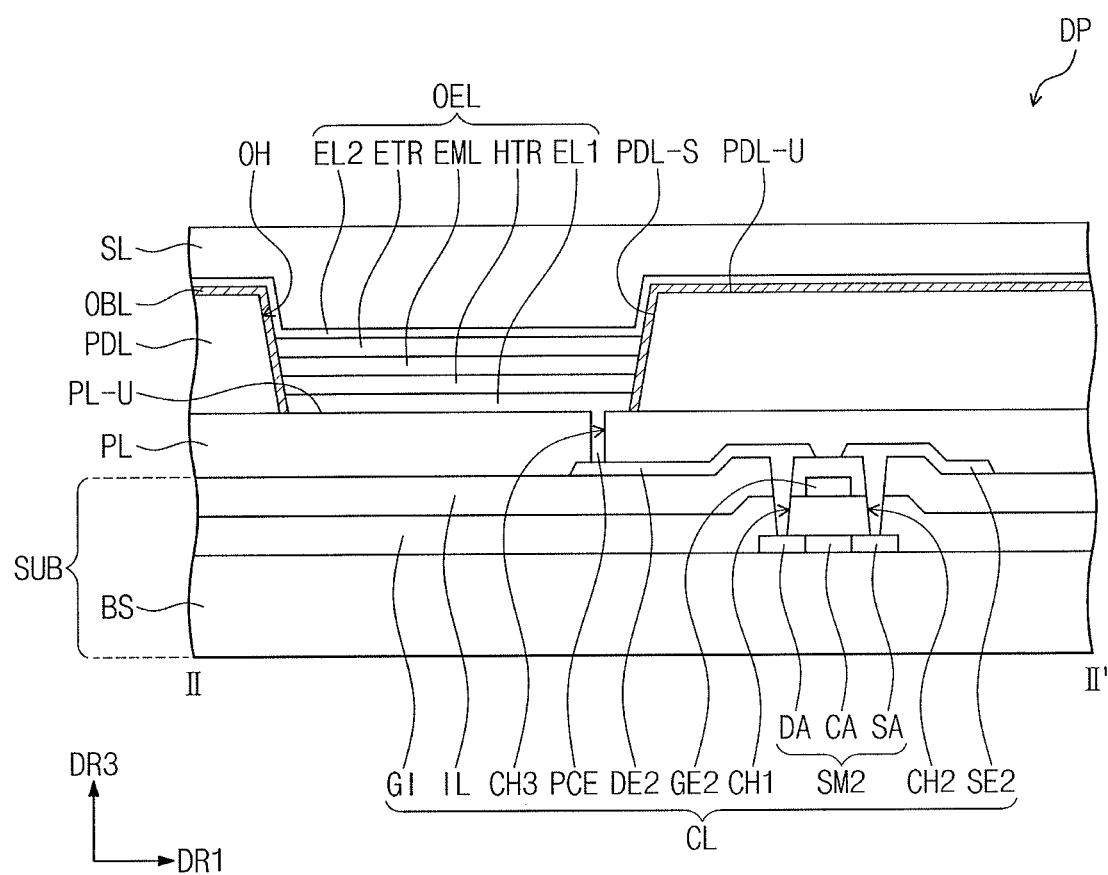
FIG. 4 illustrates a cross-sectional view taken along a line II-II' of FIG. 3.

FIG. 3 illustrates a plan view of one pixel included in the display panel DP (see FIG. 2) of the display device according to an embodiment. FIG. 4 illustrates a cross-sectional view corresponding to a line II-II' of FIG. 3.

A pixel PX of FIG. 3 may be one of the three kinds of pixels PX-B, PX-G, and PX-R included in the display panel DP illustrated in FIG. 2. The pixel PX may be connected to an interconnection part including a gate line GL, a data line DL, and a driving voltage line DVL. The pixel PX may include thin film transistors TFT1 and TFT2 connected to the interconnection part, and an organic electroluminescent element OEL and a capacitor Cst connected to the thin film transistors TFT1 and TFT2.

In an implementation, as illustrated in FIG. 3, one pixel PX may be connected to one gate line GL, one data line DL, and one driving voltage line DVL. In an implementation, a plurality of pixels PX may be connected to one gate line GL, one data line DL, and one driving voltage line DVL. In an implementation, one pixel PX may be connected to at least one gate line GL, at least one data line DL, and at least one driving voltage line DVL.

The gate line GL may extend in the first direction DR1. The data line DL may extend in the second direction DR2 intersecting the gate line GL. The driving voltage line DVL may extend in substantially the same direction (i.e., the second direction DR2) as the data line DL. The gate line GL may transmit a scan signal to the thin film transistors TFT1 and TFT2, the data line DL may transmit a data signal to the thin film transistors TFT1 and TFT2, and the driving voltage line DVL may provide a driving voltage to the thin film transistors TFT1 and TFT2.

The thin film transistors TFT1 and TFT2 may include a driving thin film transistor TFT2 for controlling the organic electroluminescent element OEL, and a switching thin film transistor TFT1 for switching the driving thin film transistor TFT2. In an implementation, one pixel PX may include two thin film transistors TFT1 and TFT2. In an implementation, one pixel PX may include one thin film transistor and one capacitor or may include three or more thin film transistors and two or more capacitors.

The switching thin film transistor TFT1 may include a first gate electrode GE1, a first source electrode SE1, and a first drain electrode DE1. The first gate electrode GE1 may be connected to the gate line GL, and the first source electrode SE1 may be connected to the data line DL. The first drain electrode DE1 may be connected to a first common electrode CE1 through a fifth contact hole CH5. The switching thin film transistor TFT1 may transmit the data signal provided from the data line DL to the driving thin film transistor TFT2 in response to the scan signal applied to the gate line GL.

The driving thin film transistor TFT2 may include a second gate electrode GE2, a second source electrode SE2, and a second drain electrode DE2. The second gate electrode GE2 may be connected to the first common electrode CE1. The second source electrode SE may be connected to the driving voltage line DVL. The second drain electrode DE2 may be connected to a first electrode EL1 through an electrode connection hole CH3.

The first electrode EL1 may be electrically connected to a circuit layer CL through a connection electrode PCE filling the electrode connection hole CH3. For example, the first electrode EL1 may be electrically connected to the second drain electrode DE2 of the driving thin film transistor TFT2. A common voltage may be applied to a second electrode EL2, and a light emitting layer EML emits light depending on an output signal of the driving thin film transistor TFT2, thereby displaying an image. The first electrode EL1, the second electrode EL2, and the light emitting layer EML will be described later in more detail.

The capacitor Cst may be connected between the second gate electrode GE2 and the second source electrode SE2 of the driving thin film transistor TFT2. The capacitor Cst stores and retains the data signal inputted to the second gate electrode GE2 of the driving thin film transistor TFT2. The capacitor Cst may include the first common electrode CE1 connected to the first drain electrode DE1 through a sixth contact hole CH6, and a second common electrode CE2 connected to the driving voltage line DVL.

Referring to FIG. 4, the display panel DP included in the display device according to an embodiment may include the organic electroluminescent element OEL. In an implementation, the display panel DP may include a pixel defining layer PDL defining a light emitting area of the organic electroluminescent element OEL. In an implementation, the organic electroluminescent element OEL may be on a substrate SUB in the display panel DP, and the display panel DP may further include an encapsulating layer SL disposed on the organic electroluminescent element OEL.

The substrate SUB of the display panel DP may include the circuit layer CL. The substrate SUB may include a base substrate BS and the circuit layer CL on the base substrate BS. Referring to FIGS. 3 and 4, the circuit layer CL may include, e.g., the gate line GL, the data line DL, the driving voltage line DVL, the thin film transistors TFT1 and TFT2, semiconductor patterns SM1 and SM2, and the capacitor Cst. In an implementation, the circuit layer CL may include a gate insulating layer GI and an interlayer insulating layer IL.

The base substrate BS may use a suitable substrate. The base substrate BS may be a flexible substrate. The base substrate BS may be a glass substrate or a plastic substrate formed using a polymer resin. For example, the base substrate BS may include polyethylene terephthalate (PET), polyethylene naphthalate (PEN), polyimide, or polyethersulfone. The base substrate BS may be selected in consideration of mechanical strength, thermal stability, transparency, surface flatness, ease of handling, and waterproofing. The base substrate BS may be transparent.

A substrate buffer layer may be provided on the base substrate BS. The substrate buffer layer may help prevent impurities from being diffused into the switching thin film transistor TFT1 and the driving thin film transistor TFT2. The substrate buffer layer may be formed of silicon nitride (SiNx), silicon oxide (SiOx), and/or silicon oxynitride (SiOxNy). The substrate buffer layer may be omitted according to a process condition and a material of the base substrate BS.

A first semiconductor pattern SM1 and a second semiconductor pattern SM2 may be provided on the base substrate BS. The first semiconductor pattern SM1 and the second semiconductor pattern SM2 may be formed of a semiconductor material and may operate as active layers of the switching thin film transistor TFT1 and the driving thin film transistor TFT2, respectively. Each of the first and second semiconductor patterns SM1 and SM2 may include a source portion SA, a drain portion DA, and a channel portion CA provided between the source portion SA and the drain portion DA. Each of the first and second semiconductor patterns SM1 and SM2 may be formed of an inorganic semiconductor or an organic semiconductor. The source portion SA and the drain portion DA may be doped with N-type dopants or P-type dopants.

The gate insulating layer GI may be provided on the first semiconductor pattern SM1 and the second semiconductor pattern SM2. The gate insulating layer GI may cover the first semiconductor pattern SM1 and the second semiconductor pattern SM2. The gate insulating layer GI may be formed of an organic insulating material or an inorganic insulating material.

The first gate electrode GE1 and the second gate electrode GE2 may be provided on the gate insulating layer GI. The first gate electrode GE1 and the second gate electrode GE2 may cover an area corresponding to the channel portion CA of the first semiconductor pattern SM1 and an area corresponding to the channel portion CA of the second semiconductor pattern SM2, respectively.

The interlayer insulating layer IL may be provided on the first gate electrode GE1 and the second gate electrode GE2. The interlayer insulating layer IL may cover the first gate electrode GE1 and the second gate electrode GE2. The interlayer insulating layer IL may be formed of an organic insulating material or an inorganic insulating material.

The first source electrode SE1, the first drain electrode DE1, the second source electrode SE2, and the second drain electrode DE2 may be provided on the interlayer insulating layer IL. The second drain electrode DE2 may be in contact with the drain portion DA of the second semiconductor pattern SM2 through a first contact hole CH1 formed in the gate insulating layer GI and the interlayer insulating layer IL, and the second source electrode SE2 may be in contact with the source portion SA of the second semiconductor pattern SM2 through a second contact hole CH2 formed in the gate insulating layer GI and the interlayer insulating layer IL. The first source electrode SE1 may be in contact with the source portion of the first semiconductor pattern SM1 through a fourth contact hole CH4 formed in the gate insulating layer GI and the interlayer insulating layer IL, and the first drain electrode DE1 may be in contact with the drain portion of the first semiconductor pattern SM1 through the fifth contact hole CH5 formed in the gate insulating layer GI and the interlayer insulating layer IL.

An insulating layer PL may be on the substrate SUB. The insulating layer PL may be provided on the first source electrode SE1, the first drain electrode DE1, the second source electrode SE2, and the second drain electrode DE2. In the display device of an embodiment, the electrode connection hole CH3 may be defined in the insulating layer PL. The connection electrode PCE may be formed in the electrode connection hole CH3. The connection electrode PCE may connect the second drain electrode DE2 of the circuit layer CL to the first electrode EL of the organic electroluminescent element OEL to be described below. For example, the connection electrode PCE may fill the electrode connection hole CH3 to connect the first electrode EL1 to the second drain electrode DE2.

The pixel defining layer PDL may be on the insulating layer PL. An opening OH may be defined in the pixel defining layer PDL. For example, the opening OH exposing (e.g., overlying or extending through the pixel defining layer PDL to the insulating layer PL) a region of the insulating layer PL may be defined in the pixel defining layer PDL. The pixel defining layer PDL may partition the organic electroluminescent element OEL such that the organic electroluminescent element OEL corresponds to each of the pixels PX.

The pixel defining layer PDL may be formed of a polymer resin. For example, the pixel defining layer PDL may include a polyacrylate-based resin or a polyimide-based region. The pixel defining layer PDL may further include an inorganic material in addition to the polymer resin. In an implementation, the pixel defining layer PDL may include a light absorbing material or may include a black pigment or a black dye. The pixel defining layer PDL including the black pigment or the black dye may be realized as a black pixel defining layer. When the pixel defining layer PDL is formed, carbon black may be used as the black pigment or the black dye.

In an implementation, the pixel defining layer PDL may be formed of an inorganic material. For example, the pixel defining layer PDL may be formed of at least one of silicon nitride (SiNx), silicon oxide (SiOx), or silicon oxynitride (SiOxNy).

The display device according to an embodiment may include a light blocking layer OBL in the display panel DP. Referring to FIG. 4, the light blocking layer OBL may be on a top surface PDL-U and a side surface PDL-S of the pixel defining layer PDL. The light blocking layer OBL may be on the side surface PDL-S of the pixel defining layer PDL exposed by or in the opening OH and the top surface PDL-U of the pixel defining layer PDL. For example, the light blocking layer OBL may cover the top surface PDL-U and the side surface PDL-S of the pixel defining layer PDL. For example, the light blocking layer OBL may cover the side surface PDL-S, exposed through or in the opening OH, and the top surface PDL-U of the pixel defining layer PDL, and thus the organic electroluminescent element OEL may not be in contact with the pixel defining layer PDL in the opening OH.

The light blocking layer OBL may be directly on the pixel defining layer PDL. As noted above, in the present specification, when a member or element is referred to as being 'directly on' another member or element, there are no intervening members or elements present. The light blocking layer OBL may be directly on the pixel defining layer PDL to help prevent light provided from the outside of the display panel DP from being transmitted to the pixel defining layer PDL.

The light blocking layer OBL may absorb external light provided from the outside of the display panel DP. A wavelength of the external light absorbed to the light blocking layer OBL may be any suitable wavelength. In an implementation, the light blocking layer OBL may absorb light of a wavelength band of 350 nm or more. In an implementation, the light blocking layer OBL may absorb light of a wavelength band of 400 nm or more. In an implementation, the light blocking layer OBL may absorb light of a wavelength band ranging from 350 nm to 450 nm. In an implementation, the light blocking layer OBL may absorb light of a wavelength band ranging from 400 nm to 450 nm. In an implementation, the light blocking layer OBL may absorb light of the wavelength band of 400 nm or more overlapping with an emission wavelength band of the organic electroluminescent element OEL.

The light blocking layer OBL may include a light absorbent. The light blocking layer OBL may include at least one light absorbent in accordance with a desired light blocking wavelength band. In an implementation, the light absorbent may include, e.g., a benzotriazole-based light absorbent, a benzophenone-based light absorbent, a salicylic acid-based light absorbent, a salicylate-based light absorbent, a cyanoacrylate-based light absorbent, a cinnamate-based light absorbent, an oxanilide-based light absorbent, a polystyrene-based light absorbent, a polyferrocenylsilane-based light absorbent, a methine-based light absorbent, an azomethine-based light absorbent, a triazine-based light absorbent, a para-amino benzoic-acid-based light absorbent, a cinnamic acid-based light absorbent, or an urocanic acid-based light absorbent. In an implementation, the light blocking layer OBL may include a suitable light absorbent. The light blocking layer OBL may include a plurality of light absorbents of which kinds are different from each other.

In an implementation, the light blocking layer OBL may include at least one light absorbent absorbing light of the wavelength band ranging from 350 nm to 450 nm. In an implementation, the light blocking layer OBL may include a light absorbent absorbing light of a wavelength band of 450 nm or more. For example, the light blocking layer OBL may absorb light of an ultraviolet wavelength band and/or light of a visible wavelength band.

The display device of an embodiment may include the light blocking layer OBL to block light of a specific wavelength band, which light could damage the pixel defining layer PDL in the external light provided from the outside of the display panel DP. Thus, it is possible to help reduce or minimize characteristic deterioration of the organic electroluminescent element OEL, which could be caused by an out-gassing material occurring when the pixel defining layer PDL is damaged.

In addition, the light blocking layer OBL may not be disposed at a light emitting path of the organic electroluminescent element OEL, and the light blocking layer OBL may block the external light provided toward the pixel defining layer PDL without affecting characteristics of light emitting from the light emitting layer EML. The light blocking layer OBL according to an embodiment may not affect light emitting characteristics of the organic electroluminescent element OEL, and the light blocking layer OBL may freely select or include various light absorbents necessary for protecting the pixel defining layer PDL.

The organic electroluminescent element OEL may be on the insulating layer PL. In an implementation, the organic electroluminescent element OEL may be in the opening OH defined in the pixel defining layer PDL. For example, the first electrode ELL at least one organic layer HTR, EML and ETR, and a second electrode EL2 may be sequentially stacked on the insulating layer PL in the third direction DR3 corresponding to a thickness direction, and the organic electroluminescent element OEL may include the first electrode ELL the at least one organic layer HTR, EML and ETR, and the second electrode EL2. For example, the at least one organic layer HTR, EML and ETR in the organic electroluminescent element OEL may include a hole transfer region HTR, the light emitting layer EML, and an electron transfer region ETR.

The first electrode EL1 of the organic electroluminescent element OEL may be on the region of the insulating layer PL exposed through the opening OH. The first electrode EL1 has conductivity. The first electrode EL1 may be formed of a metal alloy or a conductive compound. The first electrode EL1 may be an anode. The first electrode EL1 may be a pixel electrode. As described above, the first electrode EL1 may be electrically connected to the circuit layer CL through the electrode connection hole CH3 formed in the insulating layer PL. For example, the first electrode EL1 may be electrically connected to the second drain electrode DE2 of the driving thin film transistor TFT2 through the connection electrode PCE filling the electrode connection hole CH3.

In an implementation, as illustrated in FIG. 4, the first electrode EL1 may be in the opening OH. In an implementation, the first electrode EL1 may extend from the opening OH so as to be on the insulating layer PL or the pixel defining layer PDL. In this case, a portion of a top surface of the first electrode EL1 may be exposed by the opening OH defined in the pixel defining layer PDL.

In an implementation, the first electrode EL1 may be a reflective electrode in the display panel DP of the display device according to an embodiment. In an implementation, the first electrode EL1 may be a transparent electrode or a semitransparent electrode. When the first electrode EL1 is the semitransparent electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). In an implementation, the first electrode EL1 may have a multi-layered structure that includes a reflective layer or semitransparent layer formed of the above exemplified material and a transparent conductive layer formed of indium tin oxide (ITO), indium zinc oxide (IZO), zinc oxide (ZnO), or indium tin zinc oxide (ITZO).

The at least one organic layer HTR, EML and ETR may be on the first electrode EL1. The organic electroluminescent element OEL may include the hole transfer region HTR on the first electrode EL1, the light emitting layer EML on the hole transfer region HTR, and the electron transfer region ETR on the light emitting layer EML.

The hole transfer region HTR may have a single-layered structure formed of a single material, a single-layered structure formed of different materials from each other, or a multi-layered structure including a plurality of layers formed of different materials from each other. For example, the hole transfer region HTR may have the single-layered structure formed of different materials. In an implementation, the hole transfer region HTR may have, e.g., a structure of a hole injection layer and a hole transfer layer sequentially stacked on the first electrode EL1, a structure of the hole injection layer, the hole transfer layer and a buffer layer sequentially stacked on the first electrode EL1, a structure of the hole injection layer and the buffer layer sequentially stacked on the first electrode EL1, a structure of the hole transfer layer and the buffer layer sequentially stacked on the first electrode EL1, or a structure of the hole injection layer, the hole transfer layer and an electron stop layer sequentially stacked on the first electrode EL1.

For example, the hole transfer region HTR may include the hole injection layer and the hole transfer layer, and a suitable hole injection material and a suitable hole transfer material may be used in the hole injection layer and the hole transfer layer, respectively.

The light emitting layer EML may be provided on the hole transfer region HTR. The light emitting layer EML may have a single-layered structure formed of a single material, a single-layered structure formed of different materials from each other, or a multi-layered structure including a plurality of layers formed of different materials from each other.

The light emitting layer EML may use a suitable material. For example, the light emitting layer EML may be formed of a material emitting red light, green light, and/or blue light and/or may include a fluorescent material or a phosphorescent material. In addition, the light emitting layer EML may include a host or a dopant.

The electron transfer region ETR may be provided on the light emitting layer EML. The electron transfer region ETR may include at least one of a hole stop or blocking layer, an electron transfer layer, or an electron injection layer.

When the electron transfer region ETR includes the electron injection layer and the electron transfer layer, a suitable electron injection material and a suitable electron transfer material may be used in the electron injection layer and the electron transfer layer, respectively.

The second electrode EL2 may be provided on the electron transfer region ETR. The second electrode EL2 may be a common electrode or a cathode. The second electrode EL2 may be formed of a metal alloy or a conductive compound. The second electrode EL2 may be a transparent electrode, a semitransparent electrode, or a reflective electrode. When the second electrode EL2 is the transparent electrode, the second electrode EL2 may be formed of a transparent metal oxide such as indium tin oxide (ITO), indium zinc oxide (IZO), zinc oxide (ZnO), or indium tin zinc oxide (ITZO).

When the second electrode EL2 is the semitransparent electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). In an implementation, the second electrode EL2 may have a multi-layered structure that includes a reflective layer or semitransparent layer formed of the above exemplified material and a transparent conductive layer formed of indium tin oxide (ITO), indium zinc oxide (IZO), zinc oxide (ZnO), or indium tin zinc oxide (ITZO).

Referring to FIG. 4, the second electrode EL2 may be in an area overlapping with the first electrode EL1 and may further extend onto the pixel defining layer PDL. In an implementation, the second electrode EL2 may be connected to an auxiliary electrode, and a resistance of the second electrode EL2 can be reduced.

In an implementation, the first electrode EL1 may be the reflective electrode, and the second electrode EL2 facing the first electrode EL1 may be the transparent electrode.

The encapsulating layer SL may be provided on the second electrode EL2. The encapsulating layer SL may cover the second electrode EL2. The encapsulating layer SL may include a single layer or a plurality of stacked layers. The encapsulating layer SL may include at least one of an organic layer or an inorganic layer. In an implementation, the encapsulating layer SL may include at least one organic layer and at least one inorganic layer.

For example, the encapsulating layer SL may be a thin film encapsulation layer. The encapsulating layer SL protects the organic electroluminescent element OEL. The encapsulating layer SL may cover a top surface of the second electrode EL2 disposed in the opening OH and may fill a remaining region of the opening OH. A black printed layer may be partially disposed on one surface of the encapsulating layer SL. For example, the black printed layer may be disposed on the one surface of the encapsulating layer SL, which is adjacent to the second electrode EL2. The black printed layer may be disposed to correspond to the pixel defining layer PDL. In an implementation, the encapsulating layer SL may be omitted, and a separate encapsulating member may be additionally disposed on the organic electroluminescent element OEL.

In an implementation, the encapsulating layer SL may include a light absorbent. For example, the encapsulating layer SL may include a first light absorbent absorbing light of a wavelength band ranging from 350 nm to 450 nm.

Figure 5:
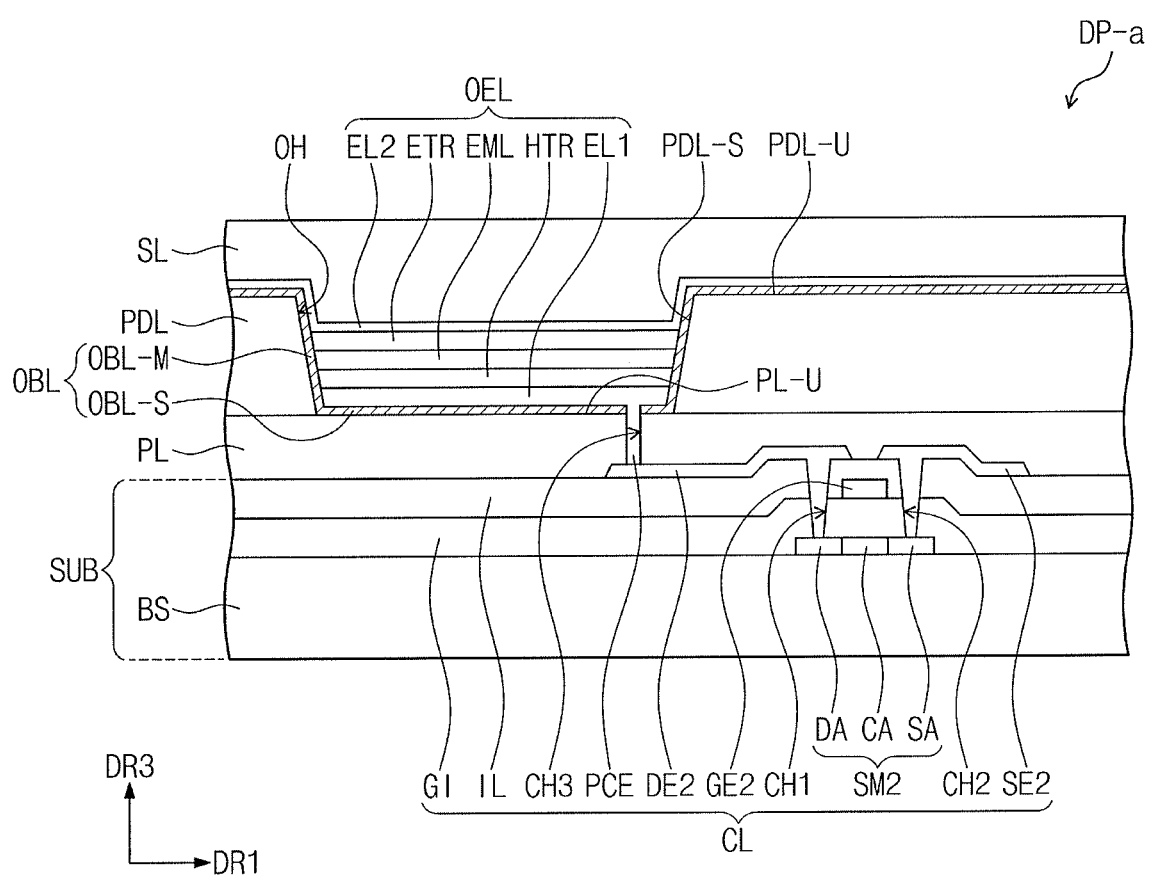
FIG. 5 illustrates a cross-sectional view taken along the line II-II' of FIG. 3.

FIG. 5 illustrates another embodiment of a display panel included in a display device according to an embodiment. For example, FIG. 5 illustrates a cross-sectional view corresponding to the line II-II' of FIG. 3. In the embodiment of FIG. 5, the descriptions to the same elements or components as in the embodiments of FIGS. 1 to 4 may be omitted or mentioned briefly for the purpose of ease and convenience in description. For example, differences between the present embodiment and the above embodiments will be mainly described hereinafter.

A light blocking layer OBL may further include an auxiliary light blocking portion OBL-S in a display panel DP-a of the embodiment of FIG. 5, as compared with the embodiment of FIG. 4. The auxiliary light blocking portion OBL-S may be on a region of a top surface PL-U of the insulating layer PL exposed through the opening OH. For example, the light blocking layer OBL may include a main light blocking portion OBL-M on the top surface PDL-U and the side surface PDL-S of the pixel defining layer PDL, and the auxiliary light blocking portion OBL-S on the region of the top surface PL-U of the insulating layer PL exposed through the opening OH. The auxiliary light blocking portion OBL-S may be directly on the top surface PL-U of the insulating layer PL exposed through the opening OH. For example, the auxiliary light blocking portion OBL-S may be between the insulating layer PL and the first electrode EL1. For example, the auxiliary light blocking portion OBL-S may be disposed under the first electrode EL1.

The auxiliary light blocking portion OBL-S may block light that is provided from the outside of the display panel DP-a to the insulating layer PL. For example, the auxiliary light blocking portion OBL-S may help prevent light passing through the organic electroluminescent element OEL from being provided to or reaching the insulating layer PL. For example, the first electrode EL1 may be the transparent electrode or the semitransparent electrode in the display panel DP-a illustrated in FIG. 5.

The auxiliary light blocking portion OBL-S may include a light absorbent. The auxiliary light blocking portion OBL-S may include the same light absorbent as the main light blocking portion OBL-M. The auxiliary light blocking portion OBL-S may be integrally formed with the main light blocking portion OBL-M as a single unitary body.

In an implementation, as illustrated in FIG. 5, the electrode connection hole CH3 may be defined in the insulating layer PL and the auxiliary light blocking portion OBL-S on the insulating layer PL. The connection electrode PCE may fill the electrode connection hole CH3 to connect the first electrode EL1 to the second drain electrode DE2 of the circuit layer CL.

Figure 6:
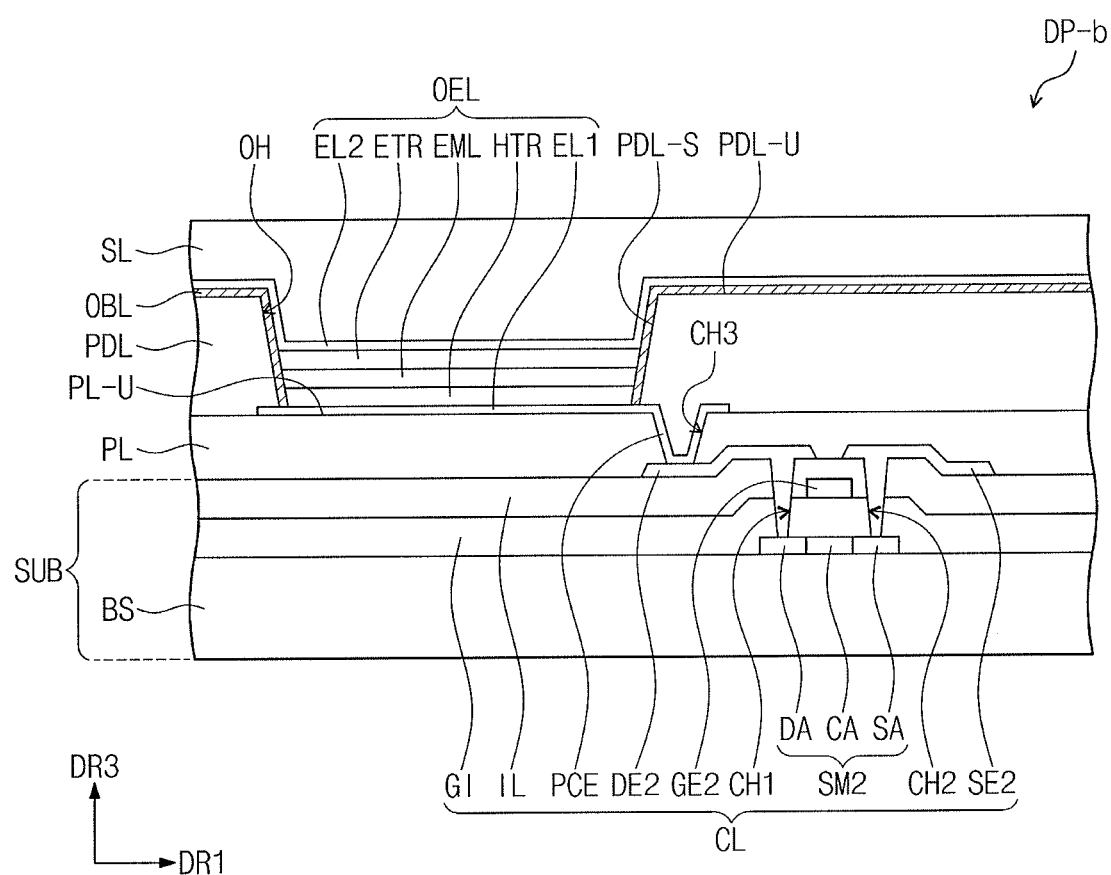
FIG. 6 illustrates a cross-sectional view of a display panel included in a display device according to an embodiment.

FIG. 6 illustrates still another embodiment of a display panel included in a display device according to an embodiment. In the embodiment of FIG. 6, the descriptions to the same elements or components as in the embodiments of FIGS. 1 to 5 may be omitted or mentioned briefly for the purpose of ease and convenience in description. For example, differences between the present embodiment and the above embodiments will be mainly described hereinafter.

Referring to FIG. 6, a display panel DP-b may include the substrate SUB including the circuit layer CL, the insulating layer PL on the substrate SUB, a first electrode EL1 on the insulating layer PL, and the pixel defining layer PDL in which the opening OH exposing a top surface of the first electrode EL1 is defined.

The first electrode EL1 of the organic electroluminescent element OEL in FIG. 4 or 5 may be disposed in the opening OH. Unlike these embodiments of FIGS. 4 and 5, the first electrode EL1 in the display panel DP-b of FIG. 6 may further extend onto a region of the top surface PL-U of the insulating layer PL not overlapping with (e.g., not exposed by or through) the opening OH.

In FIG. 6, the light blocking layer OBL may cover the side surface PDL-S of the pixel defining layer PDL exposed by or in the opening OH and the top surface PDL-U of the pixel defining layer PDL. In FIG. 6, a connection electrode PCE may connect the first electrode EL1 to the second drain electrode DE2.

In an implementation, the first electrodes EL1 may be the reflective electrodes in the display panels DP and DP-b of FIGS. 4 and 6. For example, external light provided toward the pixel defining layer PDL may be absorbed by the light blocking layer OBL, and light provided toward the insulating layer PL (e.g., through the opening OH) may be blocked or reflected by the first electrode EL1.

Each of the display devices including the display panels DP and DP-b illustrated in FIGS. 4 and 6 may include the light blocking layer OBL covering the side surface PDL-S and the top surface PDL-U of the pixel defining layer PDL, and thus light provided from the outside of the display panel DP or DP-b toward the pixel defining layer PDL can be blocked to help prevent the pixel defining layer PDL from being damaged by the external light.

The display device including the display panel DP-a illustrated in FIG. 5 may include the light blocking layer OBL that covers the side surface PDL-S and the top surface PDL-U of the pixel defining layer and the region of the top surface PL-U of the insulating layer PL exposed through or by the opening OH, and thus external light provided toward the pixel defining layer PDL and the insulating layer PL may be blocked by the light blocking layer OBL. As a result, the external light may be blocked by the light blocking layer OBL, and damage of the pixel defining layer PDL and/or the insulating layer PL by the external light may be reduced or minimized to prevent damage of the organic electroluminescent element OEL adjacent to the pixel defining layer PDL and/or the insulating layer PL.

Figure 7:
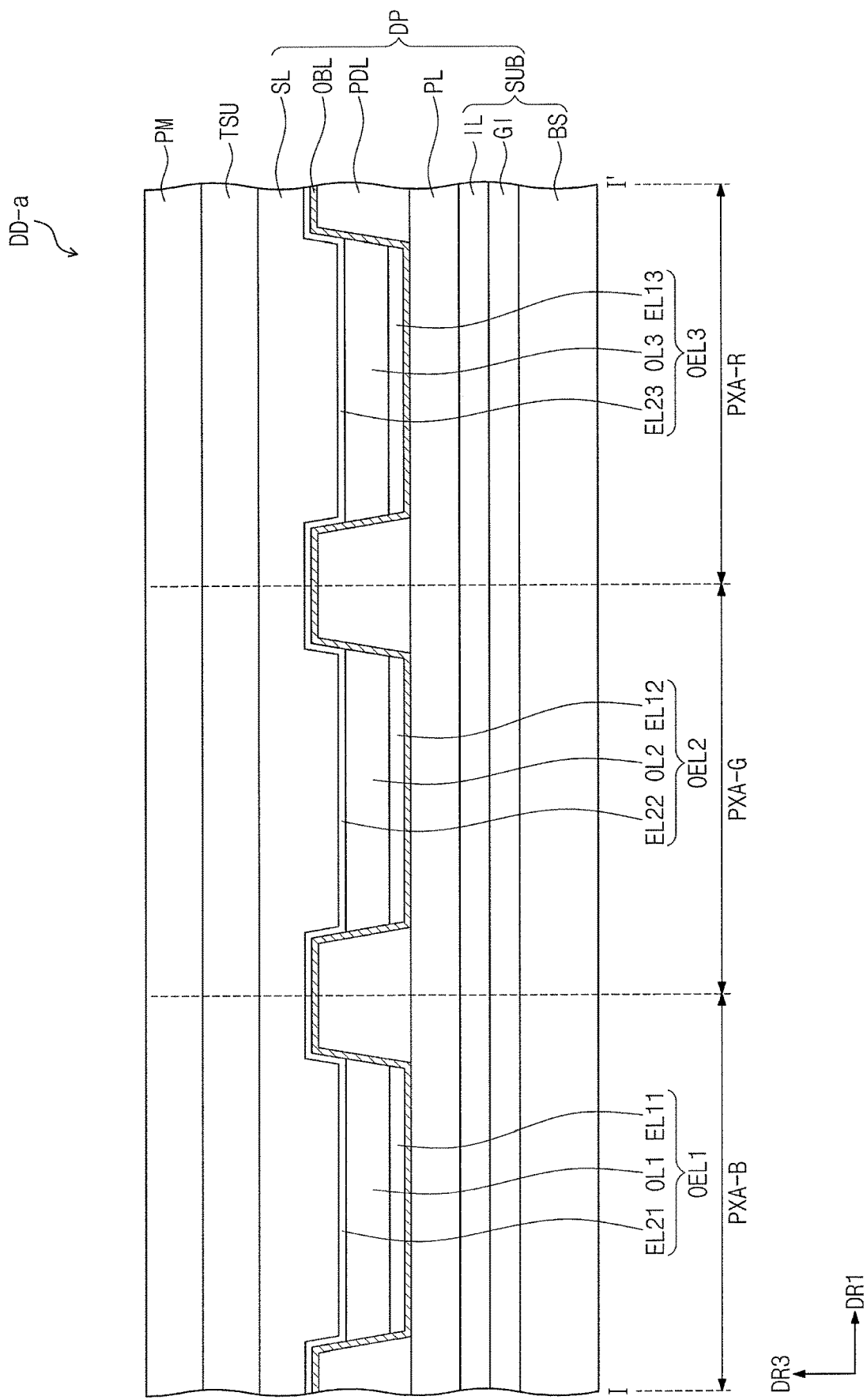
FIG. 7 illustrates a cross-sectional view taken along a line I-I' of FIG. 1 to illustrate a display device according to an embodiment.
Figure 8:
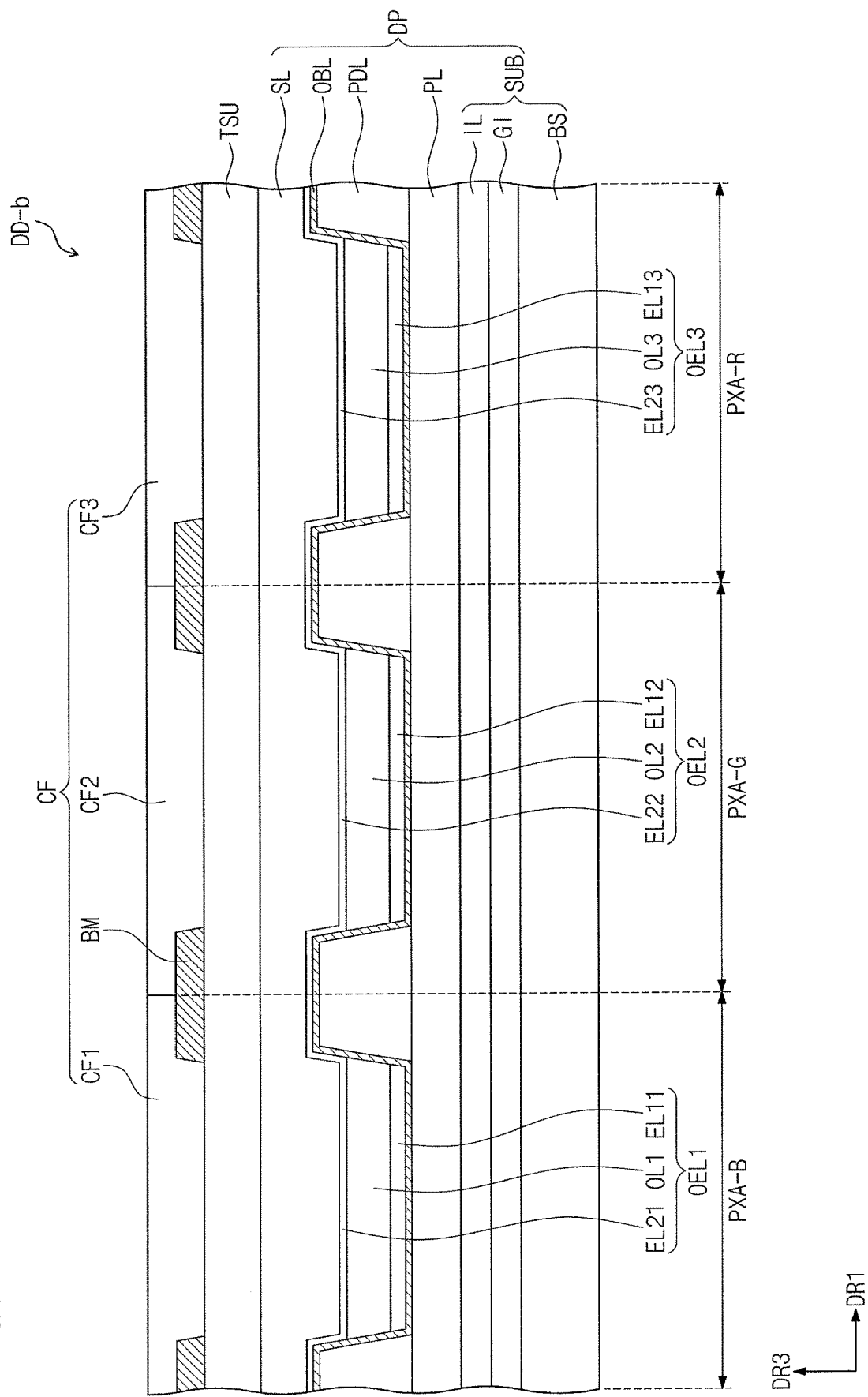
FIG. 8 illustrates a cross-sectional view taken along the line I-I' of FIG. 1 to illustrate a display device according to an embodiment.

FIGS. 7 and 8 illustrate cross-sectional views of display devices according to some embodiments. FIGS. 7 and 8 are cross-sectional views corresponding to a line I-I' of the display device DD illustrated in FIG. 1.

Referring to FIGS. 7 and 8, in each of display devices DD-a and DD-b according to some embodiments, a display panel DP may include a base substrate BS, a gate insulating layer GI, an interlayer insulating layer IL, an insulating layer PL, a pixel defining layer PDL, organic electroluminescent elements OEL1, OEL2 and OEL3, and a encapsulating layer SL.

The display panel DP may include a plurality of pixel areas PXA-B, PXA-G, and PXA-R. For example, the display panel DP may include a first pixel area PXA-B, a second pixel area PXA-G, and a third pixel area PXA-R that emit lights of which wavelengths are different from each other. In the embodiments of FIGS. 7 and 8, the first pixel area PXA-B may be a blue pixel area, the second pixel area PXA-G may be a green pixel area, and the third pixel area PXA-R may be a red pixel area. For example, the display panel DP may include the blue pixel area, the green pixel area, and the red pixel area. For example, the blue pixel area may be a blue light emitting area emitting blue light, and the green pixel area and the red pixel area may be a green light emitting area and a red light emitting area, respectively. In an implementation, the pixel areas PXA-B, PXA-G, and PXA-R may be light emitting areas that respectively correspond to the plurality of pixels PX-B, PX-G, and PX-R described with reference to FIG. 2.

The first pixel area PXA-B may be an area in which a first organic electroluminescent element OEL1 having a first organic layer OL1 is disposed. The second pixel area PXA-G may be an area in which a second organic electroluminescent element OEL2 is disposed, and the third pixel area PXA-R may be an area in which a third organic electroluminescent element OEL3 is disposed.

For example, the first organic electroluminescent element OEL1 may include a first electrode EL11, the first organic layer OL1, and a second electrode EL21. In an implementation, the first organic layer OL1 may include a hole transfer region, a light emitting layer, and an electron transfer region. For example, the first organic layer OL1 may include the light emitting layer emitting blue light. The second organic electroluminescent element OEL2 may include a first electrode EL12, a second organic layer OL2, and a second electrode EL22, and the third organic electroluminescent element OEL3 may include a first electrode EL13, a third organic layer OL3, and a second electrode EL23. The second organic layer OL2 may include a light emitting layer emitting green light, and the third organic layer OL3 may include a light emitting layer emitting red light.

In an implementation, each of the first to third organic electroluminescent elements OEL1 to OEL3 may emit light having a specific color, e.g., one of the blue light, the green light, and the red light. In an implementation, white light, cyan light, magenta light, and/or yellow light may be added or provided.

In an implementation, the first to third organic electroluminescent elements OEL1 to OEL3 may emit light of the same wavelength band. In an implementation, each of the first to third organic electroluminescent elements OEL1 to OEL3 may include a plurality of light emitting layers stacked in the third direction DR3 corresponding to the thickness direction. In this case, the plurality of light emitting layers may emit lights of different wavelength bands from each other, two or more of the plurality of light emitting layers may emit lights of different wavelength bands from each other, or the plurality of light emitting layers may emit light of the same wavelength band.

The display device DD-a according to the embodiment of FIG. 7 may include a polarizing member PM on the display panel DP. The polarizing member PM may correspond to the optical member OM of the display device DD according to the embodiment illustrated in FIG. 1.

The polarizing member PM may be disposed on the organic electroluminescent elements OEL1, OEL2, and OEL3 of the display panel DP. The polarizing member PM may block reflected light when light provided from the outside of the display device DD-a is incident on the display panel DP and exits again.

The polarizing member PM may be a circular polarizer having an anti-reflection function. In an implementation, the polarizing member PM may include a linear polarizer and a λ/4 phase retarder. The linear polarizer may be disposed on the λ/4 phase retarder. A λ/2 phase retarder may further be disposed between the linear polarizer and the λ/4 phase retarder in the polarizing member PM. The polarizing member PM including the linear polarizer and the λ/4 phase retarder may have the anti-reflection function.

The polarizing member PM may include a light absorbent. For example, the polarizing member PM may include a second light absorbent that absorbs ultraviolet light of a wavelength band ranging from 350 nm to 400 nm. The second light absorbent may be included in the linear polarizer or the phase retarder of the polarizing member PM. In an implementation, the second light absorbent may be included in an adhesive included in the polarizing member PM. The second light absorbent may be absorb light of 400 nm or less, unlike the light absorbent included in the light blocking layer described above. For example, the second light absorbent may absorb light of 400 nm or less, and the second light absorbent may not affect light emitted the organic electroluminescent elements OEL1, OEL2, and OEL3 even though the second light absorbent is included in the polarizing member PM on the organic electroluminescent elements OEL1, OEL2, and OEL3 (e.g., in the path of light emitted by the device). For example, the second light absorbent may be the same as or different from the first light absorbent which may be included in the encapsulating layer SL.

Referring to FIG. 7, the display device DD-a according to the embodiment may further include an input sensor TSU. The input sensor TSU may be between the display panel DP and the polarizing member PM. The input sensor TSU may be directly on the encapsulating layer SL of the display panel DP. For example, the input sensor TSU may be directly on the display panel DP without an additional adhesive.

In the embodiment illustrated in FIG. 7, the light blocking layer OBL may be on the top surface and the side surface of the pixel defining layer PDL and the region of the top surface of the insulating layer PL exposed through or by the opening OH. The light blocking layer OBL may absorb light provided to the display panel DP through the polarizing member PM to help prevent the pixel defining layer PDL and the insulating layer PL from being exposed to the light.

The display device DD-b according to the embodiment of FIG. 8 may further include a color filter member CF. Referring to FIG. 8, the display device DD-b may further include the color filter member CF on the display panel DP. The color filter member CF may correspond to the optical member OM of the display device DD according to the embodiment illustrated in FIG. 1. The color filter member CF may help block reflected light when light provided from the outside of the display device DD-b is incident on the display panel DP and then exits again.

The color filter member CF may include first to third conversion parts CF1, CF2, and CF3 corresponding to a plurality of color filter parts and a light shielding part BM between the first to third conversion parts CF1, CF2, and CF3. In an implementation, as illustrated in FIG. 8, the light shielding part BM may overlap with a boundary between the conversion parts CF1, CF2, and CF3. In an implementation, a portion of the light shielding part BM may not overlap with the first to third conversion parts CF1, CF2, and CF3.

Referring to FIG. 8, the first conversion part CF1 may overlap with the first pixel area PXA-B, and the second conversion part CF2 and the third conversion part CF3 may overlap with the second pixel area PXA-G and the third pixel area PXA-R, respectively. The light shielding part BM may overlap with the pixel defining layer PDL.

When the first pixel area PXA-B, the second pixel area PXA-G, and the third pixel area PXA-R are the blue pixel area, the green pixel area, and the red pixel area, respectively, the first conversion part CF1, the second conversion part CF2, and the third conversion part CF3 may be a blue filter part, a green filter part and a red filter part, respectively.

In an implementation, the color filter member CF may include a light absorbent. For example, the color filter member CF may include a third light absorbent that absorbs light of a wavelength band ranging from 350 nm to 400 nm. The third light absorbent may be included in the conversion parts CF1, CF2, and CF3 of the color filter member CF. The third light absorbent may be absorb light of 400 nm or less, unlike the light absorbent included in the light blocking layer OBL described above. For example, the third light absorbent may absorbs light of 400 nm or less, and the third light absorbent may not affect light emitted the organic electroluminescent elements OEL1, OEL2, and OEL3 even though the third light absorbent is included in the color filter member CF on the organic electroluminescent elements OEL1, OEL2, and OEL3 (e.g., in the path of the light emitted by the device). The third light absorbent may be the same as or different from the first light absorbent included in the encapsulating layer SL described above and the second light absorbent included in the polarizing member PM illustrated in FIG. 7.

In an implementation, as illustrated in FIG. 8, the light blocking layer OBL may be on the top surface and the side surface of the pixel defining layer PDL and the top surface of the insulating layer PL exposed through the opening OH. The light blocking layer OBL may absorb light provided toward the display panel DP through the color filter member CF to prevent the pixel defining layer PDL and the insulating layer PL from being exposed to the light.

The display device DD-b according to the embodiment of FIG. 8 may further include an input sensor TSU. The input sensor TSU may be between the display panel DP and the color filter member CF.

Figure 9A:
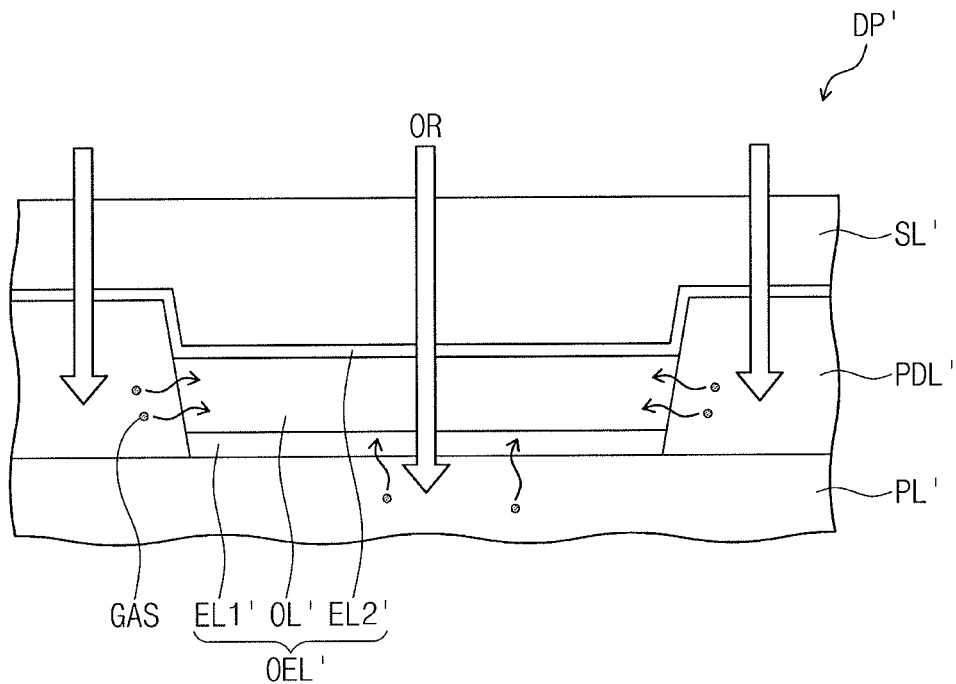
FIG. 9A illustrates a cross-sectional view of a portion of another type of display device.
Figure 9B:
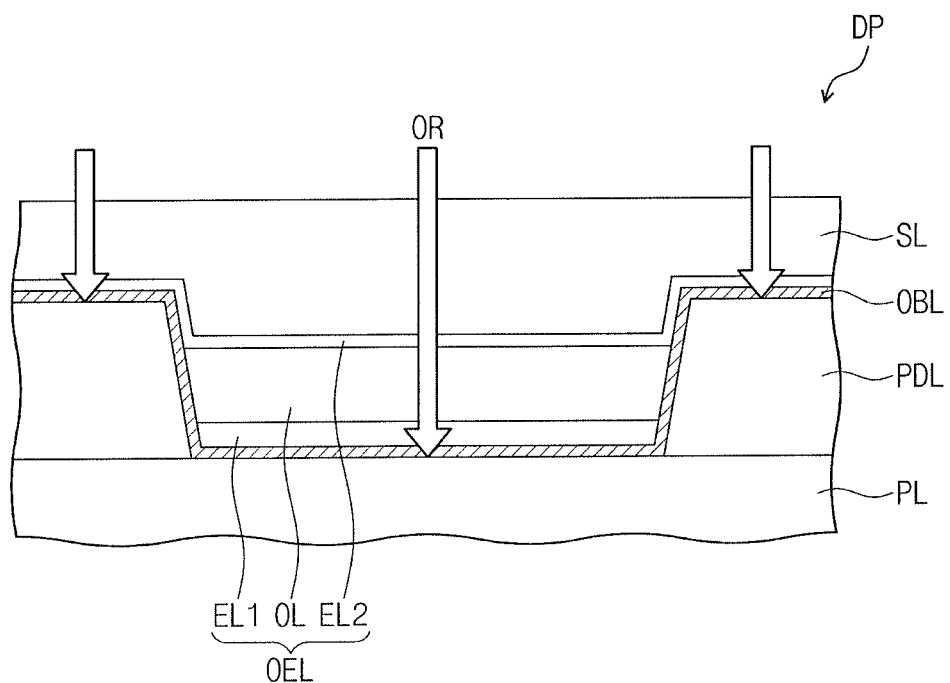
FIG. 9B illustrates a cross-sectional view of a portion of a display device according to an embodiment.

FIGS. 9A and 9B illustrate cross-sectional views of another type of display panel and a display panel according to an embodiment, respectively. Referring to FIG. 9A, in the other type of display panel DP' (not including a light blocking layer), external light OR may pass through an encapsulating layer SL' and an organic electroluminescent element OEL' and may be then provided to a pixel defining layer PDL' or an insulating layer PL'. At this time, the insulating layer PL' or the pixel defining layer PDL' may be deteriorated by the external light OR or may be decomposed by the external light OR to emit a gas material GAS. The emitted gas material GAS may damage an organic layer OL' or a first electrode EL' of the organic electroluminescent element OEL' to thereby reduce luminous efficiency of the organic electroluminescent element OEL' or to cause a shrinkage phenomenon of the organic electroluminescent element OEL'.

In the embodiment illustrated in FIG. 9B, the display panel DP may include the light blocking layer OBL which covers the pixel defining layer PDL and the region of insulating layer PL exposed by or through the opening OH. External light OR may be absorbed or blocked by the light blocking layer OBL, and the pixel defining layer PDL and the insulating layer PL may not be exposed to the external light OR. Thus, occurrence of a gas material may be inhibited. As a result, even though the display device is exposed to the external light OR, the organic electroluminescent element OEL may not be damaged. Thus, reliability of the display device may be improved.

FIGS. 10A to 10D illustrate stages in a method of manufacturing a display device according to an embodiment.

Figure 10A:
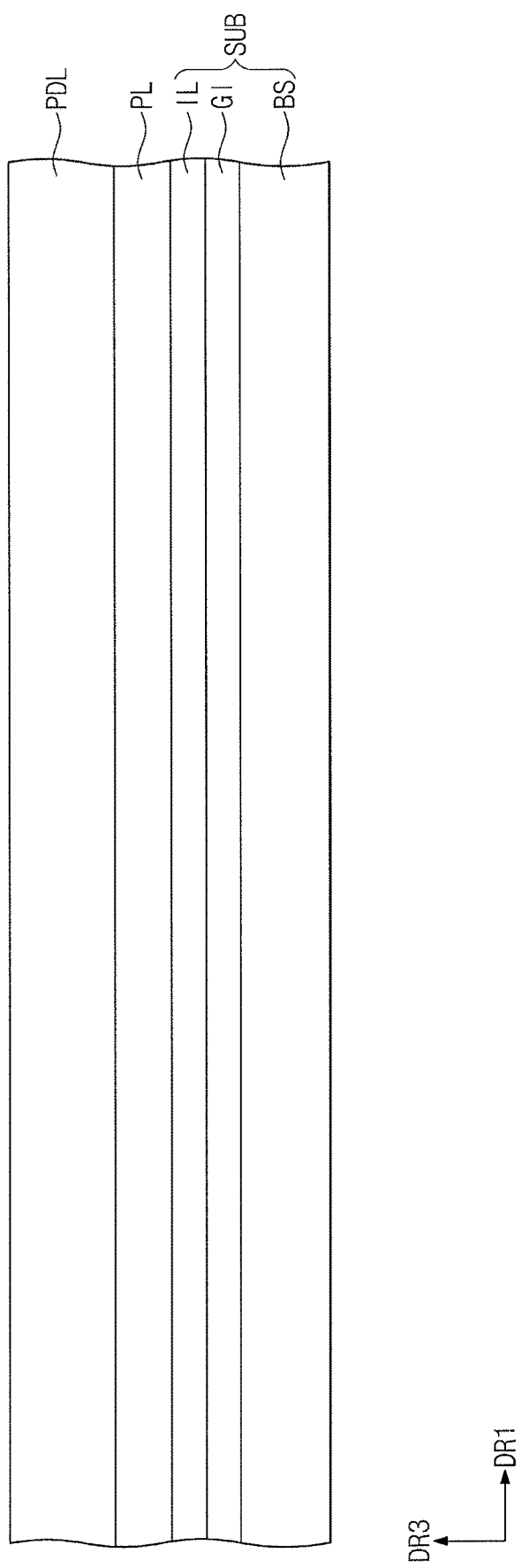
FIGS. 10A to 10D illustrate schematic views of stages in a method of manufacturing a display device according to an embodiment.
Figure 10B:
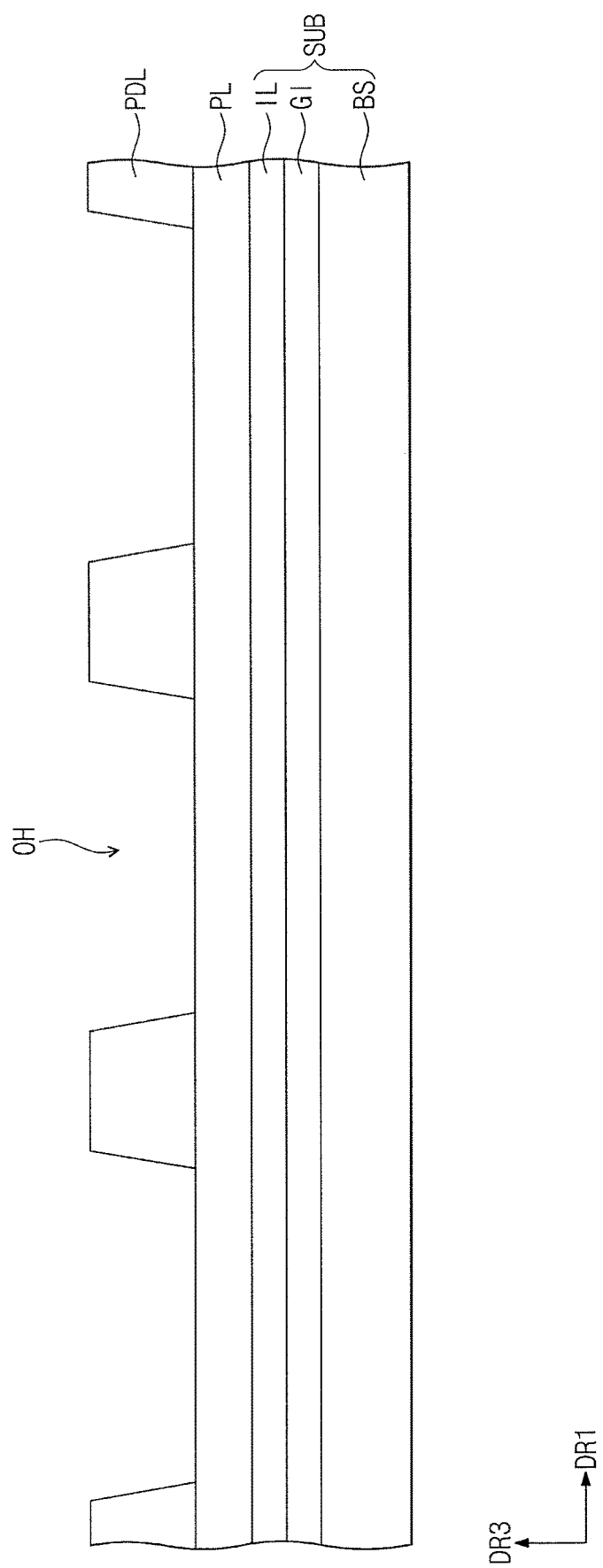

FIG. 10A illustrates a process of providing an insulating layer PL and a pixel defining layer PDL on a substrate SUB. FIG. 10B illustrates a process of forming an opening OH in the pixel defining layer PDL. The opening OH may be formed in plurality (e.g., a plurality of openings OH may be formed). In an implementation, the electrode connection hole CH3 (see FIG. 4) may also be formed in the insulating layer PL in the process of forming the opening OH. In an implementation, a mask for patterning the pixel defining layer PDL and the insulating layer PL may be used in the process of forming the opening OH in the pixel defining layer PDL. In an implementation, a two tone mask may be used to pattern the pixel defining layer PDL and the insulating layer PL at the same time.

Figure 10C:
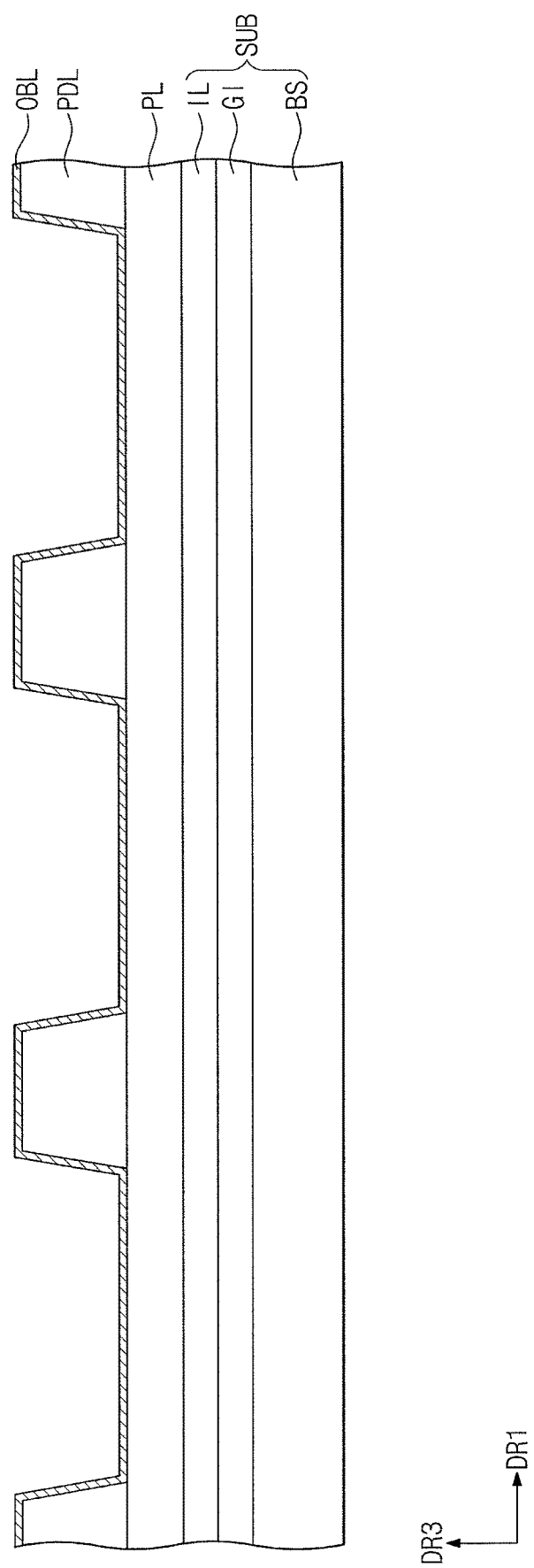

FIG. 10C illustrates a process of providing a light blocking layer OBL. The light blocking layer OBL may be provided on a top surface of the pixel defining layer PDL, a side surface of the pixel defining layer PDL, and a region of a top surface of the insulating layer PL exposed by or through the opening OH. The light blocking layer OBL may be provided using a coating method or a deposition method. The light blocking layer OBL may include a light absorbent.

Figure 10D:
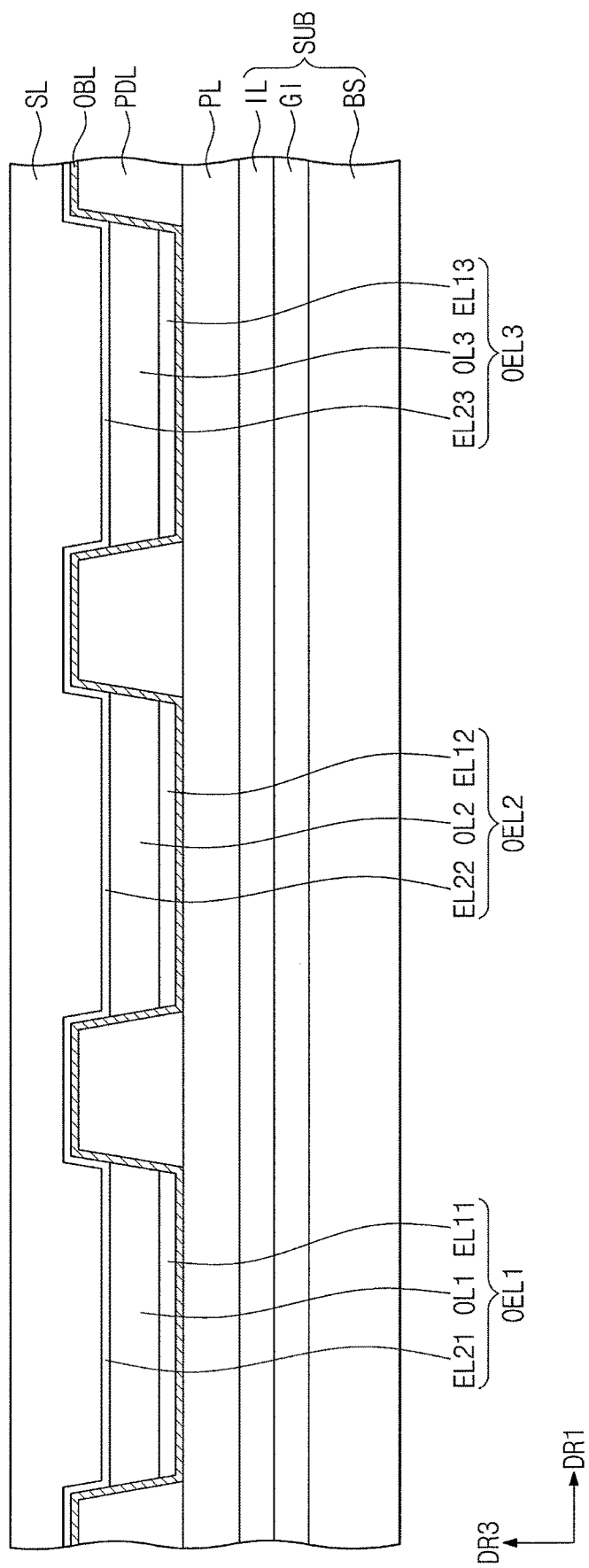

FIG. 10D illustrates a process of providing layers of organic electroluminescent elements OEL1, OEL2, and OEL3. A first electrode EL11, EL12, or EL13, an organic layer OL1, OL2, or OL3 and a second electrode EL21, EL22, or EL23 may be sequentially provided in each of the openings OH. In addition, an encapsulating layer SL may be provided on the second electrodes EL21, EL22, and EL23.

In the display device manufactured by processes including the processes of FIGS. 10A to 10D, the light blocking layer may not affect light emitting paths of the organic electroluminescent elements, and thus the light blocking layer may block external light provided to the pixel defining layer and the insulating layer without affecting light emitted from the organic electroluminescent elements. As a result, the reliability of the display device can be improved.

By way of summation and review, when display devices are used, external light may be provided to display panels in the display devices, and thus the display panels could be damaged by heat or light.

Techniques that block ultraviolet light and some visible light provided from the outside may help improve light reliability of a display panel.

The display device according to the embodiment may include the light blocking layer covering the pixel defining layer to help reduce or prevent a reliability problem which may be caused by deterioration or photolysis of the material of the pixel defining layer. For example, the display device according to the embodiment may include the light blocking layer which blocks external light provided toward the pixel defining layer and the exposed insulating layer, and thus damage of the organic electroluminescent element may be prevented and display quality of the display device may be improved.

In addition, in the display device according to the embodiment, the light blocking layer may be under the organic electroluminescent element or on a portion not overlapping with the light emitting layer, and thus the reliability and the display quality of the display device may be improved without affecting the light emitting characteristics of the organic electroluminescent element.

The embodiments may provide a display device including a light blocking layer covering a pixel defining layer.

Embodiments may provide a display device capable of improving reliability and display quality of an organic electroluminescent element by preventing a pixel defining layer, an insulating layer, etc. from being damaged by external light.

Embodiments may provide a display device capable of reducing damage of an organic electroluminescent element by external light without affecting an emission wavelength and luminous efficiency of the organic electroluminescent element.

According to an embodiment, the display device may include the light blocking layer covering the pixel defining layer, and thus damage of the pixel defining layer by external light may be minimized or prevented to improve the reliability of the organic electroluminescent element and the display quality of the display device.

According to an embodiment, the display device may include the light blocking layer covering the pixel defining layer and the insulating layer, and thus the reliability of the organic electroluminescent element may be improved without affecting an emission wavelength of the organic electroluminescent element.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a substrate that includes a circuit layer;
   an insulating layer on the substrate;
   a pixel defining layer on the insulating layer, the pixel defining layer having an opening exposing a region of a top surface of the insulating layer;
   a light blocking layer covering a top surface and a side surface of the pixel defining layer, the light blocking layer configured to absorb light of an ultraviolet wavelength band; and
   an organic electroluminescent element in the opening, wherein the organic electroluminescent element includes a first electrode on the region of the top surface of the insulating layer exposed through the opening; at least one organic layer on the first electrode; and a second electrode on the at least one organic layer,
   wherein the light blocking layer includes at least one of a benzotriazole-based light absorbent, a benzophenone-based light absorbent, a salicylic acid-based light absorbent, a salicylate-based light absorbent, a cyanoacrylate-based light absorbent, a cinnamate-based light absorbent, an oxanilide-based light absorbent, a polystyrene-based light absorbent, a polyferrocenylsilane-based light absorbent, a methine-based light absorbent, an azomethine-based light absorbent, a triazine-based light absorbent, a para-amino benzoic-acid-based light absorbent, a cinnamic acid-based light absorbent, or an urocanic acid-based light absorbent.

2. The display device as claimed in claim 1, wherein the light blocking layer is directly on the top surface and the side surface of the pixel defining layer.

3. The display device as claimed in claim 1, wherein the light blocking layer further includes an auxiliary light blocking portion on the region of the top surface of the insulating layer exposed through the opening.

4. The display device as claimed in claim 3, wherein the auxiliary light blocking portion is under the first electrode such that the auxiliary light blocking portion is between the first electrode and the insulating layer.

5. The display device as claimed in claim 1, wherein the light blocking layer absorbs light of a wavelength band ranging from 350 nm to 450 nm.

6. The display device as claimed in claim 1, wherein the light blocking layer includes at least one light absorbent that absorbs light of a wavelength band ranging from 350 nm to 450 nm.

7. The display device as claimed in claim 1, further comprising an encapsulating layer on the organic electroluminescent element,
wherein the encapsulating layer includes a first light absorbent that absorbs light of a wavelength band ranging from 350 nm to 400 nm.

8. The display device as claimed in claim 7, further comprising an input sensor directly on the encapsulating layer.

9. The display device as claimed in claim 1, further comprising a polarizing member on the organic electroluminescent element.

10. The display device as claimed in claim 9, wherein the polarizing member includes a second light absorbent that absorbs light of a wavelength band ranging from 350 nm to 400 nm.

11. The display device as claimed in claim 1, further comprising a color filter member on the organic electroluminescent element.

12. The display device as claimed in claim 11, wherein the color filter member includes a third light absorbent that absorbs light of a wavelength band ranging from 350 nm to 400 nm.

13. The display device as claimed in claim 1, wherein:
an electrode connection hole is defined in the insulating layer, and
the display device further includes a connection electrode filling the electrode connection hole and connecting the first electrode to the circuit layer.

14. A display device, comprising:
an insulating layer;
a pixel defining layer on the insulating layer, the pixel defining layer having an opening exposing a region of a top surface of the insulating layer;
a light blocking layer on a top surface of the pixel defining layer, a side surface of the pixel defining layer that is exposed by the opening, and the region of the top surface of the insulating layer that is exposed by the opening, the light blocking layer configured to absorb light of an ultraviolet wavelength band; and
an organic electroluminescent element in the opening, wherein the organic electroluminescent element includes a first electrode on the light blocking layer; at least one organic layer on the first electrode; and a second electrode on the at least one organic layer,
wherein the light blocking layer includes at least one of a benzotriazole-based light absorbent, a benzophenone-based light absorbent, a salicylic acid-based light absorbent, a salicylate-based light absorbent, a cyanoacrylate-based light absorbent, a cinnamate-based light absorbent, an oxanilide-based light absorbent, a polystyrene-based light absorbent, a polyferrocenylsilane-based light absorbent, a methine-based light absorbent, an azomethine-based light absorbent, a triazine-based light absorbent, a para-amino benzoic-acid-based light absorbent, a cinnamic acid-based light absorbent, or an urocanic acid-based light absorbent.

15. The display device as claimed in claim 14, wherein the light blocking layer includes at least one light absorbent that absorbs light of a wavelength band ranging from 350 nm to 450 nm.

16. The display device as claimed in claim 14, further comprising an optical member on the organic electroluminescent element;
wherein the optical member is a polarizing member or a color filter member.

* * * * *